United States Patent
Papathomas et al.

[11] Patent Number: 6,129,955
[45] Date of Patent: *Oct. 10, 2000

[54] ENCAPSULATING A SOLDER JOINT WITH A PHOTO CURED EPOXY RESIN OR CYANATE

[75] Inventors: Konstantinos I. Papathomas; Stephen Joseph Fuerniss, both of Endicott; Deborah Lynn Dittrich, Apalachin; David Wei Wang, Wappingers Falls, all of N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/874,219

[22] Filed: Jun. 13, 1997

Related U.S. Application Data

[62] Division of application No. 08/548,893, Oct. 26, 1995, abandoned.

[51] Int. Cl.⁷ .................. C08F 2/48; C08F 2/50; H01L 21/56
[52] U.S. Cl. .................. 427/517; 438/127; 522/31; 522/32
[58] Field of Search .................. 522/83, 84, 170; 427/517

[56] References Cited

U.S. PATENT DOCUMENTS

| | | |
|---|---|---|
| 4,058,401 | 11/1977 | Crivello . |
| 4,069,055 | 1/1978 | Crivello ............... 96/115 |
| 4,138,255 | 2/1979 | Crivello . |
| 4,173,476 | 11/1979 | Smith et al. ............... 528/90 |
| 4,175,963 | 11/1979 | Crivello ............... 430/296 |
| 4,175,973 | 11/1979 | Crivello ............... 204/159.14 |
| 4,310,469 | 1/1982 | Crivello ............... 260/446 |
| 4,479,983 | 10/1984 | Appelt et al. ............... 427/54.1 |
| 4,618,632 | 10/1986 | Su ............... 522/43 |
| 4,874,798 | 10/1989 | Koleske et al. ............... 528/366 |
| 4,946,875 | 8/1990 | Hirsekorn et al. ............... 522/170 |
| 4,999,699 | 3/1991 | Christie et al. ............... 525/107 |
| 5,134,175 | 7/1992 | Lucey ............... 522/76 |
| 5,158,989 | 10/1992 | Ogitani et al. ............... 522/77 |
| 5,180,757 | 1/1993 | Lucey ............... 522/76 |
| 5,221,560 | 6/1993 | Perkins et al. ............... 427/515 |
| 5,292,688 | 3/1994 | Hsiao et al. ............... 437/209 |
| 5,306,739 | 4/1994 | Lucey ............... 522/42 |
| 5,387,445 | 2/1995 | Horiuchi et al. ............... 428/1 |

FOREIGN PATENT DOCUMENTS

| | | |
|---|---|---|
| 2-68 | 1/1990 | Japan . |
| 3-188186 | 8/1991 | Japan . |
| 4-91118 | 3/1992 | Japan . |
| 06057103 | 3/1994 | Japan . |
| 09064237 | 3/1997 | Japan . |

*Primary Examiner*—Robert E. L. Sellers
*Attorney, Agent, or Firm*—Schmeiser, Olsen & Watts; Lawrence R. Fraley

[57] ABSTRACT

An electronic package assembly where a low profile integrated circuit chip package is soldered to an organic (e.g., epoxy resin) substrate, e.g., a printed circuit board or card, the projecting conductive leads of the integrated circuit chip package and the solder which substantially covers these leads (and respective conductors on the substrate) having been substantially covered with ultraviolet photocured encapsulant material (e.g., an epoxy resin or a cyanate with a photoinitiator and silica) to provide reinforcement for the solder-lead connections. The encapsulant material is dispensed about the solder and lead joints following solder reflow and solidification so as to substantially surround the solder and any portions of the leads not covered with solder.

9 Claims, 4 Drawing Sheets

ENCAPSULATING A SOLDER JOINT WITH A PHOTO CURED EPOXY RESIN OR CYANATE

This application is a division of application Ser. No. 08/548,893 filed Oct. 26, 1995 which application is now abandoned.

FIELD OF THE INVENTION

The present invention relates to low profile electronic circuit package structures and particularly to such packages for use within light weight, portable devices.

BACKGROUND OF THE INVENTION

Electronic package assemblies which utilize various organic substrates (e.g., printed circuit boards comprised of epoxy resin or the like material) having one or more electronic packages surface mounted thereon are known. These electronic packages include a relatively flat housing component having therein at least one semiconductor device (integrated circuit chip). This semiconductor device is, in turn, electrically connected to various conductive leads (e.g., copper) which project therefrom. One first level package known in the art is a dual in-line package (DIP). The integrated circuit chips embedded within such integrated circuit chip packages provide various functions (e.g., memory, logic, connectivity) for the overall system. The conductive leads which project from these packages are electrically coupled to respective conductor pads (e.g., copper) or the like which may form the circuitry on an upper surface of the organic substrate. Various solder compositions may be used to provide individual connections between respective pairs of leads and conductors.

Recently, there have been developed integrated circuit chip packages of relatively low profile which include an insulative housing of relatively thin construction. Such packages are referred to in the art as TSOP's, standing for Thin Small Outline Package. Such devices, being thin, occupy a minimum of height on the respective organic substrate and are further capable of being surface mounted to the substrate's respective circuitry (e.g., conductor pads) using known (e.g., soldering) techniques. These relatively new packages include memory, logic, and connectivity integrated circuit chips as the semiconductor devices thereof. Significantly, these recently developed packages are able to provide such functioning while assuring a compact, low profile, thus representing a substantial savings in space for the final product utilizing same. These surface mounted Thin Small Outline Packages result in a particularly thin total package of substrate and chips mounted thereon. The resulting packages, exemplified by PCMCIA cards, are preferred for portable computers, entertainment systems, and telecommunications handsets.

"PCMCIA" stands for the Personal Computer Memory Card International Association. PCMCIA cards are the "credit card" peripherals used as memory cards, including DRAM, SRAM, ROM, and PROM cards, modem-fax cards, mini-hard drive cards, terminal emulator cards, and the like. They are built to a PCMCIA standard. The PCMCIA standard sets the electrical, mechanical, and interface requirements for PCMCIA cards.

The small size of PCMCIA cards is intended to meet the form factor demands of portable computers. These small cards are approximately the size of a plastic credit card but several times thicker (Type I PCMCIA cards are 3.3 mm thick, Type II PCMCIA cards are 5 mm thick). It should be noted that, as used herein, Type I and Type II refer to the PCMCIA form and fit type standards, and not to the method of surface mount device attachment. PCMCIA cards are described in, for example, R. C. Alford, "Under The Hood: The PCMCIA Redefines Portability", *Byte Magazine*, December 1992, pp. 237–242; by Ken Ueltzen "Pushing The Packaging Envelope", *Circuit Assembly*, March 1992, pp. 32–35, and Richard Nass, "IC-Card Spec Adapts I/O To Memory Card Slot," *Electronic Design*, Jan. 22, 1992, pp. 45–57.

The Type I PCMCIA card itself is 3.3 millimeters thick from top cover to bottom cover, with the top cover and bottom cover having a total combined thickness of just 0.4 millimeters. This allows 2.9 millimeters of thickness for a populated, double sided, printed circuit card.

The height limitations of Type I cards, 3.3 mm, requires the use of low profile technologies, for example, either tape automated bonding (TAB) or card-on-board (COB) packaging technologies, both with specially designed low height IC chips, as TSOP IC chips. The thin, small outline package (TSOP) IC chip, with a height of 1.2 mm (0.047 inch), is particularly desirable for double sided Type I PCMCIA cards. Its low profile allows population of both sides of the PCMCIA printed circuit card.

In an alternative IC chip technology a paper thin small outline package (PTSOP) having a height of just 0.5 mm (0.020 inch) is utilized, allowing two printed circuit cards to be carried in a single PCMCIA card package. The lead pitch for TSOP IC chips is 0.5 mm (0.019 inch). Memory printed circuit cards are populated with 0.019 inch to 0.025 inch lead pitch IC chips, with approximately 1000 solder joints per printed circuit card.

It has been found that when TSOP packages, as well as similar thin packages, are surface mounted on organic substrates (and particularly those of epoxy resin or perfluorocarbon dielectric material) of relatively thick configuration (e.g., greater than about 0.050 inches thick), relatively significant thermal stress is placed on the solder-lead joints, which thermal stress can in turn adversely effect such joints, possibly causing separation thereof. Such resulting separation may cause disconnection between the lead and solder, thereby rendering the total package inoperative. Such thermal stress is caused during operation of the package as a result of relatively substantial differences in the coefficients of thermal expansion (CTE) of the organic substrate and the coefficients of expansion (CTE) of various other elements (e.g., the conductive leads, solder and package housing). Such differences are even more pronounced when thicker multi-layer organic substrates (e.g., those including several conductive layers therein which function as signal, power or ground planes) are utilized. Multilayer substrates are often desired in the computer, electronics, and telecommunications industries in order to provide additional functioning within a single package, especially a package containing a plurality of multi-function integrated circuit chips.

A clear need exists for an electronic package assembly which permits the utilization of electronic packages such as those of the TSOP variety to be effectively utilized on organic substrates, and particularly multilayer substrates.

OBJECTS OF THE INVENTION

It is, therefore, a primary object of the present invention to enhance the electronic package assembly art.

It is another object of the invention to provide an electronic package assembly which obviates the aforementioned thermal stress problem.

It is yet another object of the invention to provide such a package which can be produced on a relatively large scale, to thus benefit from the several advantages (e.g., lower cost) associated therewith.

It is yet a further object of the invention to provide a photopolymerized resin, formed of an epoxy resin or a cyanate monomer, a photoinitiator, and a dispersed phase of particulate silica, that is useful to obviate the aforementioned thermal stress problem in electronic circuit packages.

SUMMARY OF THE INVENTION

In accordance with one aspect of the invention, there is provided an electronic package assembly which comprises an organic substrate including a surface thereon having a plurality of electrical conductors positioned on the surface, an electronic package including an insulative integrated circuit chip housing located on or above the substrate's surface and including sides which include a plurality of conductive leads projecting therefrom, individual quantities of solder for substantially covering respective pairs of one such lead and a respective conductor, and encapsulant material located on these quantities of solder for substantially covering the solder so as to substantially prevent electrical disconnection between the conductive leads and the solder during operation of the electronic package assembly.

Encapsulant compositions are also disclosed in accordance with the invention. The encapsulant compositions include an epoxy resin or a cyanate monomer, a photoinitiator, and a dispersed phase of particulate silica. Where the polymer is an epoxy resin it is one having a plurality of reactive 1,2-epoxy groups. The epoxy resin is chosen from the group consisting of monomeric, polymeric, saturated, unsaturated, aliphatic, cycloaliphatic, aromatic, and heterocyclic epoxides, or a substituted epoxide, wherein the substituents are chosen from the group consisting of hydroxyl groups, ether radicals, halogen atoms, and combinations thereof, or an epoxy polyether.

Alternatively the resin is formed from cyanate esters that have two or more OCN groups and are curable through cyclotrimerization.

The photoinitiator is a aryldiazonium photoinitiator, such as onium salt chosen from the group consisting of "onium" salts with anions $BF_4^-$, $PF_6^-$, $AsF_6^-$ or $SbF_6^-$.

THE FIGURES

The invention may be understood by reference to the FIGURES appended hereto.

DETAILED DESCRIPTION OF THE INVENTION

According to our invention we provide an encapsulant having adequate thixotropy for solder joints in PCMCIA Thin Small Outline Packages (TSOPs) and a method of enhancing the robustness of such devices.

The uncured encapsulant is a composition of either a cycloaliphatic epoxy resin or a cyanate ester monomer or prepolymer and monomer combination, silica filler, and a suitable photoinitiator. Preferred photoinitiators are triarylsulfonium hexafluoroantimonates, such as Union Carbide Cyracure UVI 6974 photoinitiator. Exemplary cycloaliphatic epoxies include 3,4-epoxycyclohexylmethyl-3,4-epoxycyclohexane carboxylate (Union Carbide ERL 4221); bis(3,4-epoxycyclohexyl) adipate (Union Carbide ERL-4299), and vinyl cyclohexane diepoxide (Union Carbide 4206). The silica is preferably a fused or amorphous silica. The composition protects the soldered joints from the effects of thermal cycling.

Figure 1:
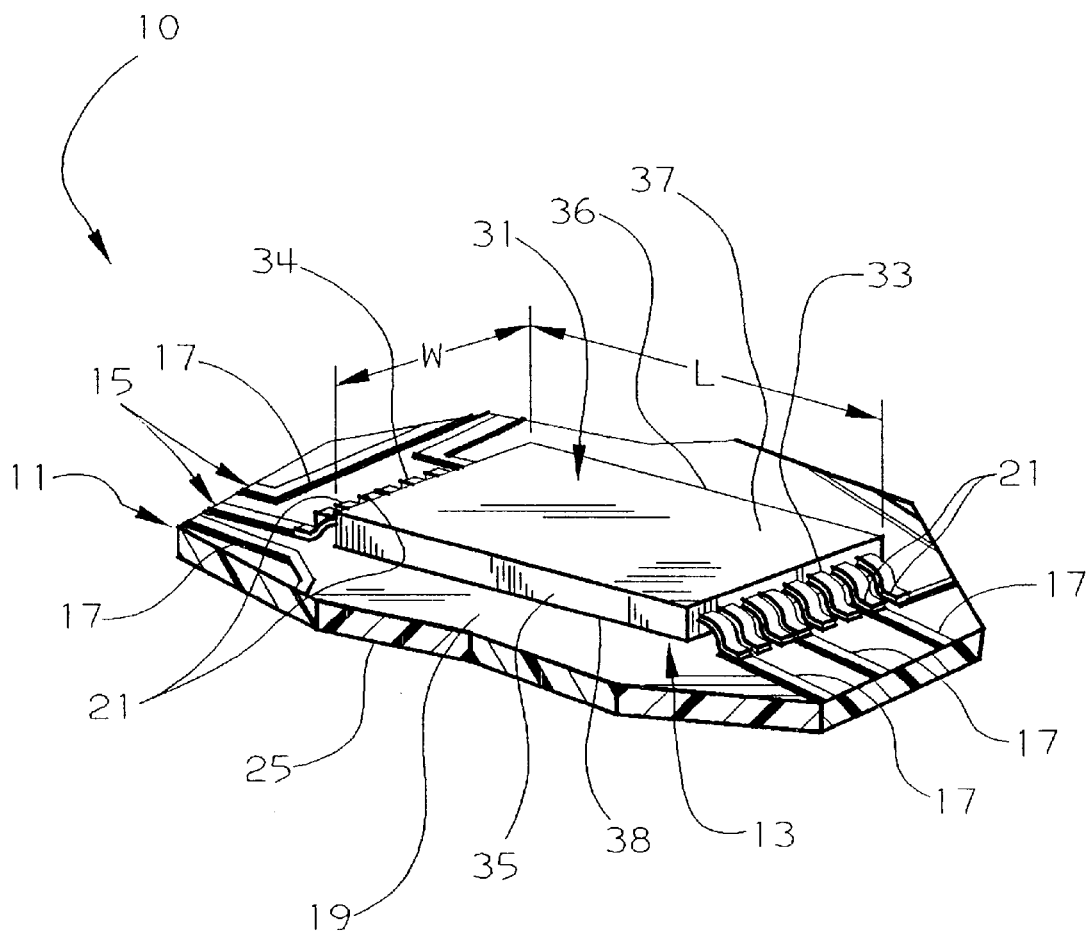
FIG. 1 is a partial perspective view of an electronic package assembly in accordance with one embodiment of the invention, prior to having encapsulant material added thereto.
Figure 2:
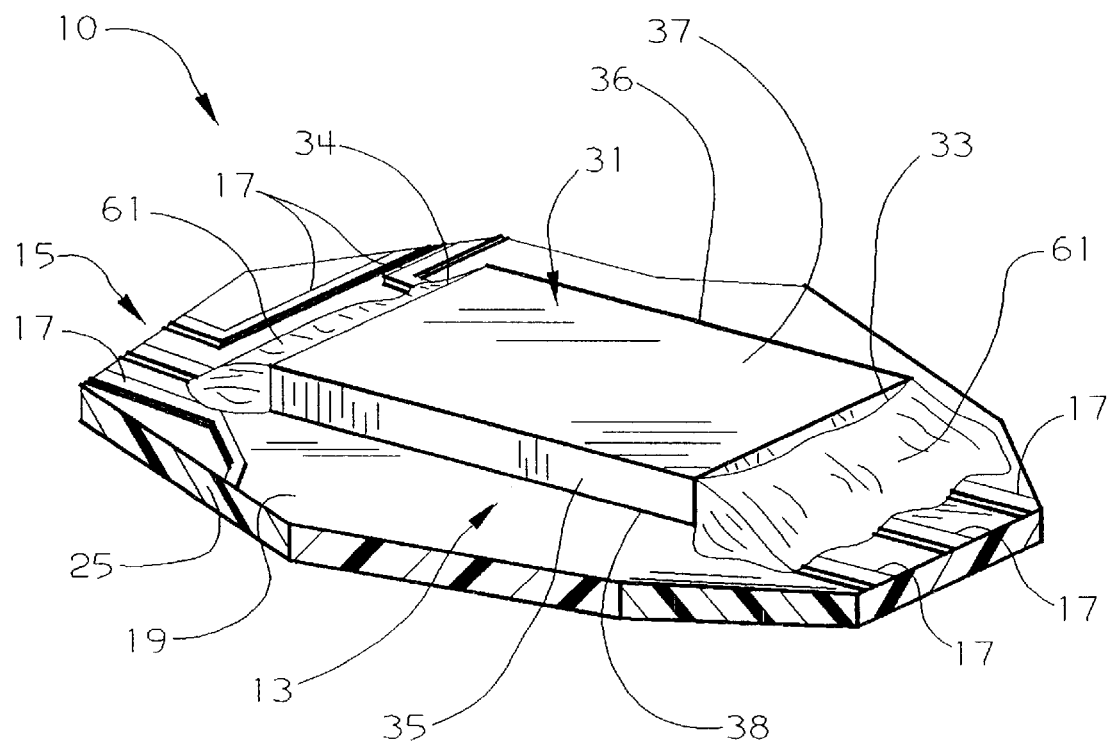
FIG. 2 is a perspective view, similar to FIG. 1, having encapsulant material applied to two opposing sides thereof and onto the electrically conductive leads (not shown) which project from these sides.
Figure 3:
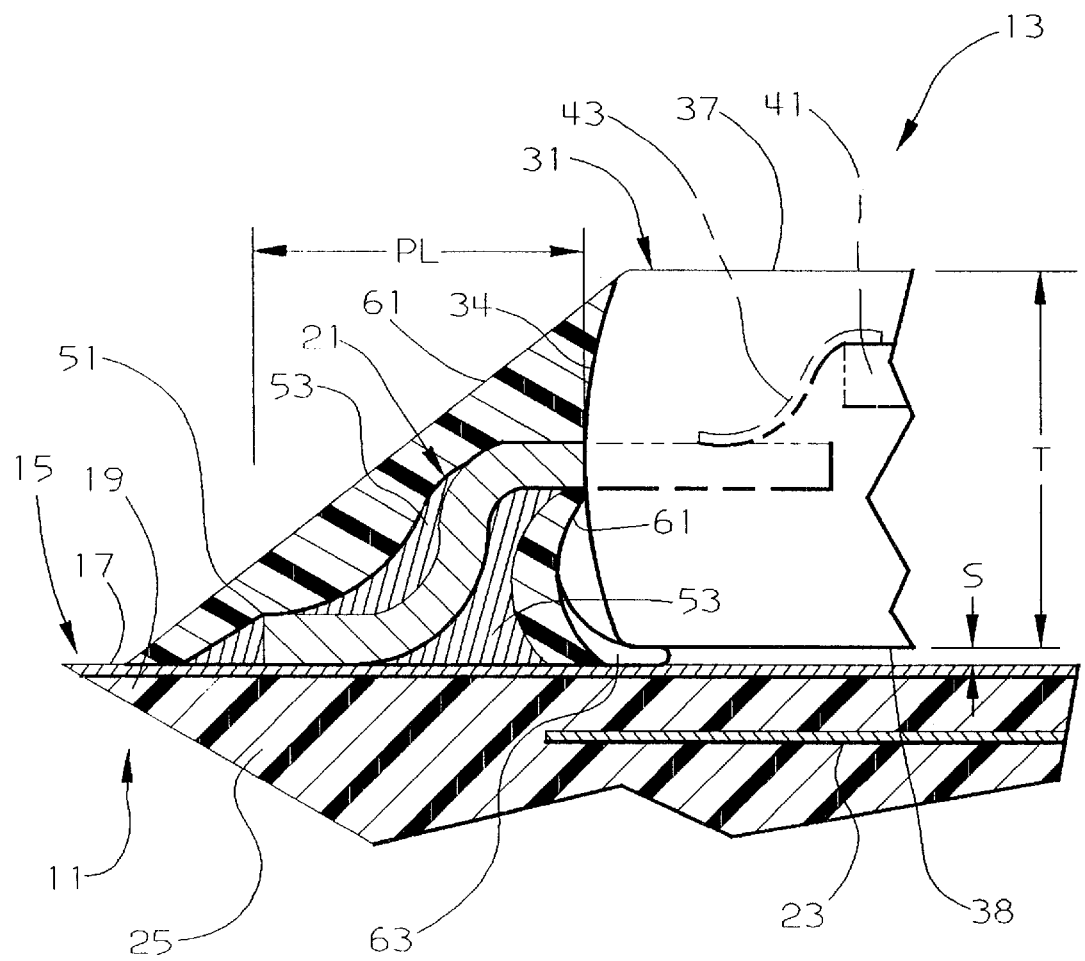
FIG. 3 is a partial elevational view, in section and on a much enlarged scale over the views in FIGS. 1 and 2, illustrating one of the sides of the invention's package having encapsulant located over the conductive leads projecting therefrom.

Electronic package structures with which the encapsulant is useful are shown in FIGS. 1–4, appended hereto. In FIG. 1, there is shown a partial view of an electronic package assembly 10 in accordance with a preferred embodiment of the invention. Package assembly 10 includes an organic substrate 11 and an integrated circuit chip electronic package 13 designed for being positioned on substrate 11 so as to be electrically connected to circuitry 15 thereof. Circuitry 15 is represented, illustratively, as a plurality of electrical conductors 17 located on an upper planar surface 19 of substrate 11. It is understood that integrated circuit chip package 13, which includes a plurality of electrically conductive leads 21 projecting from the sides thereof, is designed for being positioned on substrate 11 such that each of the conductor leads 21 is in turn electrically connected to a respective one or more of the conductors 17. Only a few conductors 17 are shown, for illustrative purposes. It is further understood that each lead may be connected to other forms of conductors which may in turn form part of substrate 11, including plated through holes having appropriate land sections (not shown), which plated through holes are in turn electrically coupled to various internal conductors (e.g., signal, power or ground planes 23, as shown in FIG. 3). Such plated through holes, lands, and other conductors are typically comprised of electrically conductive material (e.g., copper, chrome-copper-chrome, etc.) and are provided on a surface such as planar surface 19 or within substrate 11 in accordance with procedures known in the art and further description is thus not believed necessary.

The organic substrate 11 is preferably a multilayered printed circuit board having circuitry 15 located on at least its planar upper surface 19, the board comprised of a dielectric material 25 (see also FIGS. 2–4) of known composition. Preferably, this dielectric material is epoxy resin reinforced with fiberglass, also referred to in the industry as FR-4 material. Alternatively the dielectric material may be a fluorocarbon resin or a woven or nonwoven aramid structure impregnated with a thermosetting resin. In one example of the invention, substrate 11 may include a plurality of individual conductive layers, e.g., from about eight to ten individual conductive layers. The invention is not limited to this number of conductive layers, however, in that other numbers (more or less) may be provided.

Figure 4:
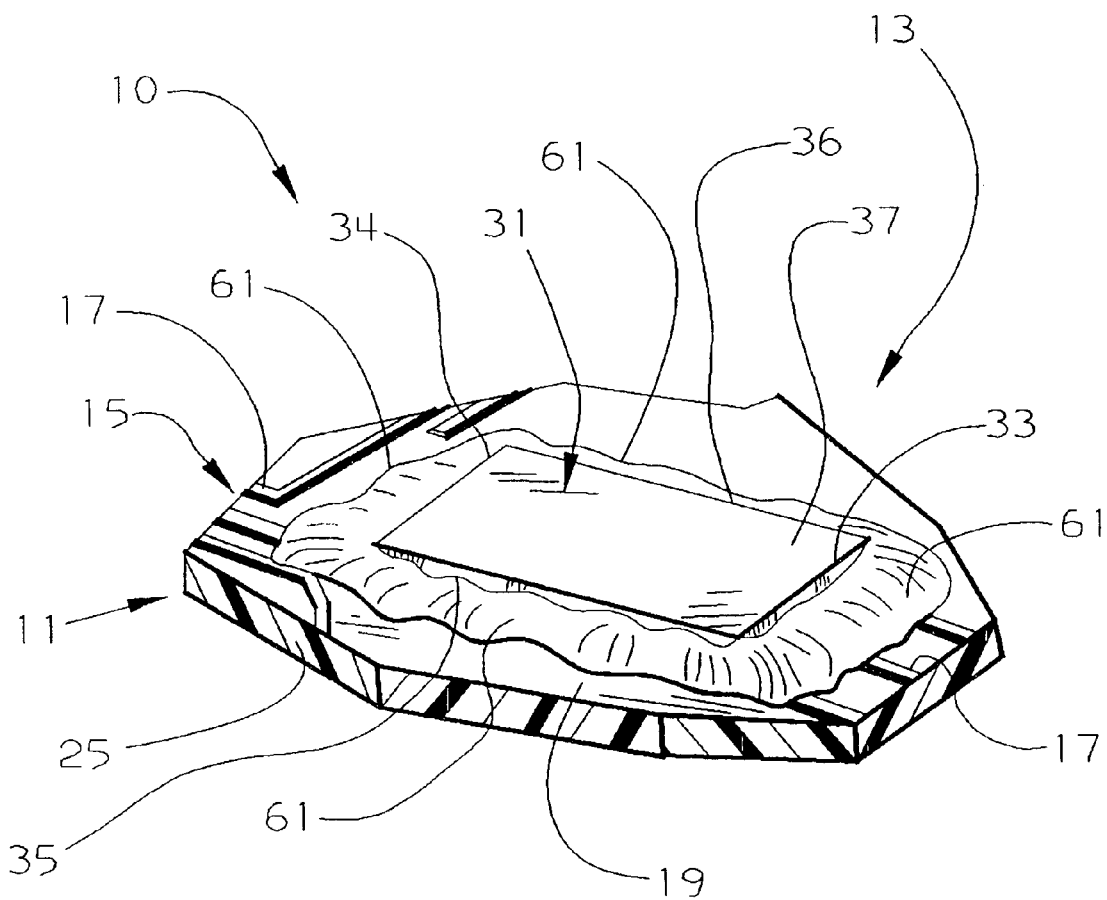
FIG. 4 is a perspective view, similar to the views in FIGS. 1 and 2, showing encapsulant material about the entire periphery (four sides) of the invention's package housing.

The integrated circuit chip package 13 includes an electrically insulative integrated circuit chip housing 31 of known plastic material. The preferred configuration for integrated circuit chip housing 31 is, as shown in FIGS. 1, 2 and 4, substantially rectangular having a total of four sides 33, 34, 35 and 36. In one example of the invention, integrated circuit chip housing 31 possessed a length (dimension "L" in FIG. 1) of about 0.750 inch and a width (dimension "W" in FIG. 1) of only about 0.300 inch. Each of the sides, or an opposite pair of the sides, include a plurality of the conductive leads 21 projecting therefrom.

Of further significance in a TSOP structure, integrated circuit chip housing 31 possesses a thickness of from only about 0.030 inch to about 0.050 inch, this thickness represented by the dimension "T" in FIG. 3. Further, integrated circuit chip housing 31 may be positioned at a slight gap (represented by the dimension "S" in FIG. 3) of only about 0.001 inch to about 0.003 inch from the circuitry 15 on surface 19. In this embodiment, it is thus seen that this relatively flat package occupies a total height of only about 0.033 to about 0.053 inches from the upper surface, including circuitry 17, of substrate 11. Although a small gap is shown in FIG. 2, the invention is also applicable to assemblies wherein the plastic housing of package 13 rests directly on (bottoms out) the upper surface 19 and/or circuitry 15.

In addition to the four sides 33, 34, 35 and 36, the flat package integrated circuit chip housing 31 also includes relatively planar upper and lower surfaces 37 and 38, respectively.

Integrated circuit chip package 13 further includes a semiconductor device (a silicon chip) located within the plastic integrated circuit chip housing 31. This semiconductor device is represented, illustratively, by the numeral 41 and is shown in phantom in FIG. 3. Preferably, device 41 is electrically connected to the respective conductive leads 21 (only one shown in FIG. 3) by wire bonding or the like, such a wire being represented by the numeral 43 and shown in phantom in FIG. 3. It is understood that device 41 and wire 43 are shown in FIG. 3 for illustration purposes only and not meant to limit the invention to the location, connection or relative sizes depicted. In such a package, each of the projecting conductive leads 21 is internally coupled to a lead frame or the like (not shown) and individually project from the respective sides of the housing in a manner as shown herein. As such, each of these leads is preferably of the curved configuration particularly shown in FIG. 3, including a terminal end 51 which depends downwardly from the package housing for being positioned on substrate 11. As stated, each conductive lead 21 is designed for being electrically coupled to a respective conductor 17 of substrate 11. Each of the conductive leads 21 of the invention are preferably of copper and have a thickness of only about 0.010 inch, these leads projecting a distance (dimension "PL" in FIG. 2) of only about 0.025 inch from the respective side (34 in FIG. 3) of integrated circuit chip housing 31.

To assure sound electrical connection between leads 21 and the respective conductor 17, a quantity of solder 53 is applied to substantially cover each mating pair of leads and conductors. That is, a singular quantity of solder is applied to substantially cover one lead and at least a portion of the respective conductor to which lead 21 is electrically coupled. In one example of the invention, each quantity of solder was comprised of 63:37 (tin:lead) solder. It is to be understood that other solder compositions may be utilized. It is also to be understood in the drawings that although only one quantity of solder 53 is shown in FIG. 3, that additional quantities are provided to cover the other paired conductor-lead embodiments. Such solder is not shown in FIG. 1 for clarity. It is understood, therefore, that in the embodiment depicted in FIG. 1, a total of sixteen individual quantities of solder will be provided. In preferred form, solder 53 is applied to the respective conductor 17 sites in paste form prior to positioning of package 13 on substrate 11. A screening operation is frequently and preferably used, following which the package is aligned such that each lead 21 will engage a respective solder paste site. The package and substrate subassembly is then placed within, e.g., passed through, a hot air oven (furnace) and heated to a predetermined temperature to effect solder paste reflow onto the respective leads, the result being the solder configuration as approximately represented in FIG. 3. If using a 63:37 tin:lead solder, this preferred temperature for attaining reflow is preferably about 185 degrees Celsius (C). This temperature does not adversely affect the package or substrate components. The configuration for solder 53 as depicted in FIG. 3 shows the solder to substantially cover the pin 21, almost substantially entirely surrounding the pin. Additionally, the solder 53 is also shown to cover at least a portion of the conductor 17 on substrate 11.

Should conductor 17 be in the form of a land or the like element (which in turn may be electrically coupled to a plated through hole extending within substrate 11), the solder 53 will cover a large portion, if not all of this land conductor.

As shown in the FIGURES, a quantity of encapsulant material 61 is applied to the opposing sides 33 and 34 of integrated circuit chip housing 31 so as to abut against these sides and substantially cover the solder 53. The encapsulant material 61, as shown in FIG. 3, substantially surrounds the entire quantity of solder 53 for each of the paired lead-conductor combinations. To be noted is that the encapsulant 61 is not shown in FIG. 1. This is to enable illustration of the assembly with solder exposed. But encapsulant 61 is provided in FIG. 2. Encapsulant 61 is applied in unpolymerized form, e.g., liquid form, with a suitable photoinitiator or photocatalyst, following the solder reflow (and solder solidification) step. In a preferred embodiment, encapsulant 61 is dispensed using at least one syringe, syringe pump, or other dispenser means. This dispensing of encapsulant may occur following a pre-heating of the substrate 11 and integrated circuit chip electronic package 31 located thereon for a predetermined time period. The substrate 11 having the integrated circuit chip package 31 soldered in position thereon, is heated to drive off the moisture therein, e.g., to within a range of from about 65 degrees C to about 85 degrees C for about one to two hours. The purpose of the heating is to drive off any undesirable moisture which may collect within the dielectric material which forms part of substrate 11. A hot air oven is preferably used to accomplish this heating. Subsequently, encapsulant 61 may be dispensed while the substrate 11 retains much of the heat from this preheating step. Following encapsulant dispense, the board with mounted package and encapsulant is positioned under a source of ultra-violet (UV) radiation and subjected to UV radiation to effect polymerization, i.e., photopolymerization, of the encapsulant 61.

A preferred encapsulant material for use in the invention is a polymer resin, and particularly an epoxy or a cyanate, or combinations thereof. This encapsulant is a flowable, liquid epoxy or cyanate material, or a combination thereof, which features the proper thixotropy to cover the leads and low stress, both of said features desirable for use with package structures of the type described herein. When properly UV photocured, the encapsulant material provides a low thermal expansion and high glass transition to assure enhanced protection (e.g., during thermal cycling). Such an encapsulant possesses a coefficient of linear thermal expansion of about 26 to 39 ppm/degrees C and a glass transition temperature of 100 to 160 degrees C. The invention is not to be limited to use of the above encapsulant material, however, in that other ultraviolet (UV) photocurable encapsulants may be successfully used herein.

It has been discovered that application of encapsulant material of the type described above to the designated locations on assembly 10 has served to significantly increase the operational life of such package assemblies, particularly those of the low profile configuration described above. By way of example, operational life was shown to be extended by a factor of about 2–5 times over package assemblies wherein encapsulant was excluded. Such encapsulant has proven to reinforce the lead-solder bond so as to, significantly, substantially prevent separation between the solder and lead elements, which separation in turn may break the connection there between and possibly render at least part of the package assembly 10 inoperative. More specifically, this encapsulant material provides such protection during package assembly operation wherein heat is generated by both the substrate and various package elements (e.g. internal silicon chip).

By way of example, the following illustrate the significant differences in the coefficients of thermal expansion (CTE) of the various elements used in one embodiment of the invention.

| ELEMENT | CTE (x 10–6 in/in/C) |
| --- | --- |
| Organic Substrate (FR-4) | 10–21 |
| Conductive Leads (Copper Alloy) | 45 |
| IC Chip Encased In Plastic Housing | 7 |
| Solder | 28 |
| Encapsulant | 26–39 |

Absent such protection afforded by encapsulant material 61, these substantially different coefficients of expansion can result in cracking or similar deformation of the solder-lead joints, such cracking possibly causing failure thereof. The use of encapsulant material of the type defined herein, applied in the manner described herein, has resulted in a much improved package assembly with prolonged life over non-encapsulated assemblies.

Although it is shown in FIG. 3 that encapsulant 61 is spaced a slight distance from the lower part of side 34 of integrated circuit chip housing 31 (thus forming a gap there between), this is not meant to limit the invention. That is, it is also possible in accordance with the teachings herein to dispense encapsulant material 61 under part or all of the under surface of integrated circuit chip housing 31, assuming of course integrated circuit chip housing 31 is spaced at a gap such as depicted in FIG. 3. Such partial positioning of encapsulant is shown in phantom in FIG. 3 and represented by the numeral 63.

In FIG. 4, all four sides 33, 34, 35 and 36 of integrated circuit chip housing 31 are shown to have encapsulant material 61 located thereabout. As stated, only two of these sides (e.g., 33 and 34) will include conductive leads projecting therefrom. However, it has been determined that the addition of encapsulant about this entire outer periphery (all four sides) of the package housing has proven to even further strengthen (reinforce) the aforementioned lead-solder joints. Such added reinforcement is considered accomplished because of the ability of the ultra violet photocured encapsulant material to act against the linear expansion of the package's housing during operation. It has not been determined necessary to provide encapsulant to the top surface 37.

The uncured encapsulant is a composition of a cycloaliphatic epoxy resin, silica filler, and a suitable photoinitiator. Preferred photoinitiators are triarylsulfonium hexafluoroantimonates, such as Union Carbide Cyracure UVI 6974 photoinitiator.

Exemplary cycloaliphatic epoxies include 3,4 epoxycyclohexylmethyl-3,4-epoxycyclohexane carboxylate (Union Carbide ERL 4221); bis(3,4-epoxycyclohexyl) adipate (Union Carbide ERL-4299), and vinyl cyclohexane diepoxide (Union Carbide 4206). Mixtures of cycloaliphatic epoxies can also be employed when desired.

The polyepoxide-containing compositions which can be cured into crosslinked networks for use in the present invention comprise organic materials having a plurality of reactive 1,2-epoxy groups. These polyepoxide materials can be monomeric or polymeric, saturated or unsaturated, aliphatic, cycloaliphatic, aromatic or heterocyclic, and they may be substituted if desired with other substituents besides the epoxy groups, e.g., hydroxyl groups, ether radicals, halogen atoms, and the like.

A widely used class of polyepoxides which can be employed according to the practice of the present invention encompasses epoxy polyethers obtained by reacting an epihalohydrin, such as epichlorohydrin, epibromohydrin, epiiodihydrin, and the like, with either a polyhydric phenol or a polyhydric alcohol. In addition, the phenolic rings, may have other substituents besides the hydroxyl group, for example, lower alkyl groups containing from one to four carbon atoms, e.g., methyl, ethyl, propyl, isopropyl, butyl, sec-butyl and tert-butyl groups, halogen atoms, i.e., fluorine, chlorine, bromine or iodine, and the like.

An illustrative, but by no means exhaustive listing of the dihydric phenols includes 4,4'-dihydroxydiphenylmethylmethane, (Bis-phenol A), 2,4'-dihydroxydiphenylmethylmethane, 3,3'-dihydroxydiphenyldiethylmethane, 3,4'-dihydroxydiphenylmethylpropylmethane, 2,3'-dihydroxydiphenylethylphenylmethane, 4,4'-dihydroxydiphenylpropylphenylmethane, 4,4'-dihydroxydiphenylbutylphenylmethane, 2,2'-dihydroxydiphenylditolylmethane, 4,4'-dihydroxydiphenyltolylmethylmethane, and the like.

Other polyhydric phenols which could also be reacted with an epihalohydrin to provide epoxy polyethers are such compounds as resorcinol, hydroquinone, substituted hydroquinones, e.g., p-tert-butylhydroquinone, and the like, indanoles such as those disclosed in U.S. Pat. No. 2,754,285 and polyhydric phenols having two hydroxyl aryl groups separated by an aliphatic chain of at least six carbon atoms in length, said chain being attached by carbon-to-carbon bonding to nuclear carbon atoms of the hydroxylaryl groups. All of such glycidyl ethers can be prepared by the method described in U.S. Pat. No. 2,538,072.

Among the polyhydric alcohols which can be reacted with an epihalohydrin to provide epoxy polyethers are such compounds as ethylene glycols, pentane diols, bis-(4-hydroxycyclohexyl)-dimethylmethane, 1,4-dimethylolbenzene, glycerol, 1,2,6-hexanetriol, trimethylol propane, manitol, sorbitol, erythritol, pentaerythritol, their dimers, trimers and higher polymers, e.g., polyethylene glycols, polypropylene glycols, triglycerol, dipentaerythritol and the like, polyallyl alcohol, polyvinyl alcohol, polyhydric thioethers such as 2,2'-dihydroxydiethyl sulfide, 2,2'-3,3'-tetrahydroxydipropyl sulfide and the like, mercapto alcohols such as monothio-glycerol, dithioglycerol and the like, polyhydric alcohol partial esters such as monostearin, pentaerythritol monoacetate; polyhydric alcohol partial esters such as monostearin, pentaerythritol monoacetate, and halogenated polyhydric alcohols such as the monochlorohydrins of glycerol, sorbitol, pentaerythritol and the like.

Epoxidized novolacs are obtained by reacting, preferably in the presence of basic catalyst such as sodium hydroxide, an epihalohydrin such as epichlorohydrin with the resinous condensate of an aldehyde, e.g., formaldehyde, and either a monohydric phenol, e.g., phenol or cresol or a polyhydric phenol, e.g. bisphenol A.

For reference purposes a comprehensive disclosure of such epoxy compositions can be found in the text entitled Epoxy resins, Chemistry and Technology, by A. May and Y. Tanaka, Marcel Decker, Inc., New York (1973) and the article "Resins for Aerospace" by C. A. May, Applied Polymer Science, ACS Symposium Series 285, R. W. Phehlein, eds., American Chemical Society, p.559 (1985).

Particularly suitable such epoxy resins include, for example, the ethers of resorcinol, catechol, hydroquinone, biphenol, bisphenol A, bisphenol K, tetrabromobisphenol A, phenol-aldehyde novolac resins, alkyl substituted phenol-aldehyde novolac resins, alkyl substituted phenol-formaldehyde resins, phenol-hydroxybenzaldehyde resins, cresol-hydroxybenzaldehyde resins, dicyclopentadiene-phenol resins, dicyclopentadiene-substituted phenol resins, bisphenol F, tetramethylbiphenol, tetramethyltetrabrobiphenol, tetramethyltribromobiphenol, tetrachlorobisphenol A, combinations thereof and the like.

Also suitable as the epoxide compound which can be employed in the present invention include those partially advanced epoxy resins disclosed in U.S. Pat. No. 4,594,291.

Also suitable as the epoxide compound are the polyglycidyl ethers of compounds having an average of more than one aliphatic hydroxyl per molecule such as for example, aliphatic diols, polyether diols, polyether tetraols, and any combination thereof. Also suitable are the alkylene oxide adducts of compounds containing an average of more than one aromatic hydroxyl group per molecule such as, for example, the ethylene oxide, propylene oxide, or butylene oxide adducts of dihydroxy phenols, biphenols, bisphenols, halogenated bisphenols, alkylated bisphenols, trisphenols, phenol-aldehyde novolac resins, halogenated phenol-aldehyde novolac resins, alkylated phenol-aldehyde novolac resins, hydrocarbon-phenol resins, hydrocarbon-halogenated phenol resins, or hydrocarbon-alkylated resins, or any combination thereof.

The reactions between epoxies and phenols and/or carboxylic acids (or anhydrides) have been extensively studied and many patents have issued which describe these well known classes or reactants. See, for example U.S. Pat. Nos. 2,216,099, 3,377,406, 3,547,885, 2,633,458, 3,477,990, 3,694,407, 2,658,885, 3,547,881, 3,738,862, Canadian Pat. No. 893,191, German Pat. DT No. 2,206,218, and the text "Handbook of Epoxy Resins" by H. Lee and K. Neville, McGraw Hill, N.Y. (1967).

Commercially available epoxy resins which may be used for the purpose are EPON series (Shell Chemicals), Araldite series (Ciba-Giegy), DER series (DOW Chemical), Epiclon Series (Dainippon Ink Chemical Industries).

The preferred cycloaliphatic epoxy resins are non-glycidyl ether epoxides containing more than one 1,2 epoxy group per molecule. These are generally prepared by epoxidizing unsaturated aromatic hydrocarbon compounds, such as cyclo-olefins, using hydrogen peroxide or peracids such as peracetic acid or perbenzoic acid. Such non-glycidyl ether cycloaliphatic epoxy resins have a ring structure wherein the epoxide group is part of the ring or is attached to the ring structure. These epoxy resins may also contain ester linkages. Suitable nonglycidyl ether cycloaliphatic epoxy resins have the following structures:

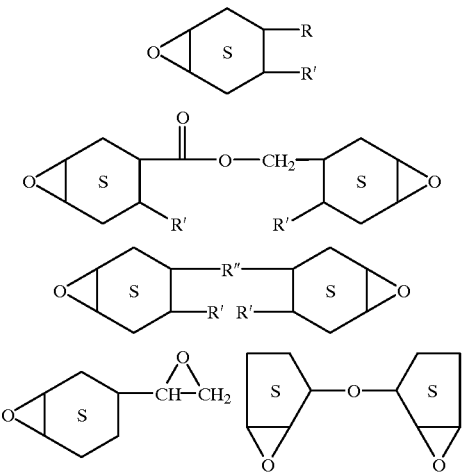

wherein: S is a saturated ring structure;

R is selected from the group of $CHOCH_2$, $O(CH_2)_nCHOCH_2$, and $OC(CH_3)_2CHOCH_2$ radicals;

n=1 to 5;

R' is selected from the group consisting of hydrogen, methyl, ethyl, propyl, butyl, and benzyl radicals;

and

R" is selected from the group consisting of $CH_2OOC$ and $CH_2OOC(CH_2)_4COO$ radicals.

Examples of suitable non-glycidyl ether cycloaliphatic epoxides include 3,4-epoxycyclohexylmethyl-3,4-epoxycyclohexane carboxylate; vinylcyclohexane dioxide which contains two epoxide groups, one of which is part of a ring structure; 3,4-epoxy-6-methylcyclohexylmethyl-3,4-epoxycyclohexane carboxylate, and dicyclopentadiene dioxide.

Other cycloaliphatic epoxy resins are suitable, including glycidyl ethers such as: 1,2-bis(2,3-epoxycyclopentyloxy)-ethane; 2,3-epoxycyclopentyl glycidyl ether; diglycidyl cyclohexane-1,2-dicarboxylate; 3,4-epoxycyclohexyl glycidyl ether; bis-(2,3-epoxycyclopentyl) ether; bis-(3,4-epoxycyclopentyl) ether; 5(6)-glycidyl-2-(1,2-epoxyethyl) bicyclo[2.2.1]heptane; cyclohexa-1,3-diene dioxide; 3,4-epoxy-6-methylcyclohexylmethyl 3',4'-epoxy-6'-methylcyclohexanecarboxylate. Also suitable are epoxy resins in which the 1,2-epoxy groups are attached to various heteroatoms or functional groups; such compounds include, for example, the N,N,O-triglycidyl derivative of 4-aminophenol, the N,N,O-triglycidyl derivative of 3-aminophenol, the glycidyl ether/glycidyl ester of salicylic acid, N-glycicyl-N'-(2-glycidyloxypropyl)-5,5-dimethylhydantoin or 2-glycicyl-1,3-bis-(5,5-dimethyl-1-glycidylhydantoin-3yl)-propane. Mixtures of cycloaliphatic epoxy resins are also suitable.

The preferred cycloaliphatic epoxy resins include 3,4-epoxycyclohexylmethyl-3,4-epoxycyclohexane carboxylate, (systematic name: 7-oxabicyclo(4.10)heptane-3-carboxylic acid 7-oxabicyclo(4.1)hept-3-ylmethyl ester) commercially available under the designation ERL-4221 from Union Carbide Company and 3,4-epoxycyclohexylmethyl-3,4-epoxycyclohexane carboxylate mixed with bis(3,4-epoxyxyxlohexyl) adipate, available under the designation ERL-4299 from Union Carbide Company.

The cycloaliphatic epoxy resins have a preferred epoxy equivalent weight of from about 50 to about 500, preferably from about 50 to about 250. The cycloaliphatic epoxy resins have a viscosity less than about 1000 cps (centipoise) at 25° C., preferably about 5 to about 900 cps, more preferably about 300 to about 600 cps, and most preferably about 300 to about 450 cps. The cycloaliphatic epoxy resins have a molecular weight of from about 200 to 700, preferably 200 to 500, and a weight per epoxide of 50 to 500, preferably 50 to 300.

Photoinduced polymerizable cyanate ester compositions and a process for making these compositions and their use in encapsulating solder connections of electronic components, comprising a cationically polymerizable cyanate monomer, prepolymer and mixtures thereof, an effective amount of modifier to enhance the fracture properties of the whole and a catalytically effective amount of an organometallic complex salt as polymerization initiator, which upon photolysis is capable of liberating at least one coordination site, and the said metal cation in the organometallic complex is selected from elements of the Periodic Groups IVB, VB, VIB, VIIB, and VIIIB are also disclosed here.

The cyanate esters that can be employed pursuant to the present invention have two or more OCN groups and are curable through cyclotrimerization. The cyanate esters can be monomeric or less preferably polymeric, including oligomers and can be represented by those materials containing the following group:

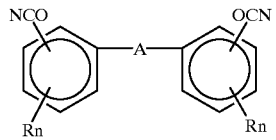

wherein A is a single bond, C(CH$_3$)H, SO$_2$, C(CF$_2$)$_2$, CH$_2$OCH$_2$, S, C(=O), OC(=O), S(=O), OP(=O)O, OP(=O)(=O)O; divalent alkylene radicals such as CH$_2$ and C(CH$_3$)$_2$, divalent alkylene radicals interrupted by heteroatoms on the chain such as O, S, and N;

R is selected from the group of hydrogen, halogens, and alkyl groups containing from 1 to 9 carbon atoms; and n is an integer from 0 to 4.

Specific cyanate esters that can be employed in the present invention are available and well-known and include those discussed in U.S. Pat. No. (s) 4,195,132, 3,681,292, 4,740,584, 4,745,215, 4,477,629, and 4,546,131; European patent application EP0147548/82, and German Laid Open Patent Application 2611796, disclosures of which are incorporated herein by reference.

Suitable polyfunctional cyanates are prepared by well known methods, for example by reacting the corresponding polyvalent phenol with a halogenated cyanate in the presence of a tertiary amine such as triethyl amine as exemplified in U.S. Pat. Nos. 3,553,244, 3,740,348, and 3,755,402.

The phenol reactant can be any aromatic compound containing. one or more reactive hydroxyl groups. The phenolic reactant is preferable a di- or tri- polyhydroxy compound of the formula:

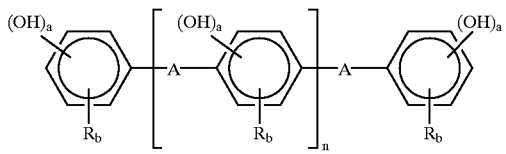

in which each a and b is independently 0, 1, 2, or 3, and at least one a is not 0; n is within the range of 0 to about 8, preferably 0 to 3; each R is independently selected from non-interfering alkyl, aryl, alkaryl, heteroatomic, heterocyclic, carbonyloxy, carboxy, and the like ring substituents, such as hydrogen, C$_{1-6}$ alkyl, C$_{1-6}$ allyl, C$_{1-6}$ alkoxy, halogen, maleimide, propargyl ether, glycidyl ether, and the like; and A is a polyvalent linking moiety which can be, for example, aromatic, aliphatic, cycloaliphatic, polycyclic, and heteroatomic. Examples of the linking moiety A include —O—, —SO$_2$—, —CO—, —OCOO—, —S—, C$_{1-12}$—, dicyclopentadienyl, aralkyl, aryl, cycloaliphatic, and a direct bond.

Examples of cyanates are as follows: cyanatobenzene, 1,3-and 1,4-dicyanatobenzene, 2-tert-butyl-1,4-dicyanatobenzene, 2,4-dimethyl-1,3-dicyanatobenzene, 2,5-ditert-butyl-1,4-dicyanatobenzene,tetramethyl-1,4-dicyanatobenzene, 4-chloro-1,3-dicyanatobenzene, 1,3,5-tricyanatobenzene, 2,2' or 4,4'-dicyanatobiphenyl, 3,3',5,5'-tetramethyl-4,4'dicyanatobiphenyl, 1,3-, 1,4-, 1,5-, 1,6-, 1,8-, 2,6-, or 2,7- dicyanatonaphthalene, 1,3,6-tricyanatonaphthalene, bis(4- cyanatophenyl)methane, bis (3-chloro-4-cyanatophenyl)methane, 2,2-bis(4-cyanatophenyl)propane, 2,2-bis(3,5-dichloro-4-cyanatophenyl)propane, 2,2-bis(3,5-dibromo-4-cyanatophenyl)propane, bis (4-cyanatophenyl) ether, bis (p-cyanophenoxyphenoxy)-benzene, di(4-cyanatophenyl) ketone, bis(4-cyanatophenyl)thioether, bis(4-cyanatophenyl)sulfone, tris (4-cyanatophenyl)phosphite, and tris(4-cyanatophenyl)phosphate. Also useful are cyanic acid esters derived from phenolic resins as disclosed in U.S. Pat. No. 3,962,184, cyanated novolak derived from novolak described in U.S. Pat. No. 4,022,755, cyanated bisphenol type poly carbonate oligomer derived from bisphenol types polycarbonate oligomer listed in U.S. Pat. No. 4,026,913, cyanato-terminated polyarylene ethers listed in U.S. Pat. No. 3,595,900, dicyanate esters free or ortho hydrogen atoms described in U.S. Pat. No. 4,740,584, mixtures of di-and tricyanates listed in U.S. Pat. No. 4,709,008, polyaromatic cyanates containing polycyclic aliphatic diradicals such as XU7178, Dow Chemical Co., of U.S. Pat. No. 4,528,366, fluorocarbon cyanates described in U.S. Pat. No. 3,733,349, and other novel cyanate compositions taught in U.S. Pat. Nos. 4,195,132 and 4,116,946, all of which are incorporated herein by reference. A discussion of such can be found in Bogan, et al., "Unique Polyaromatic Cyanate Ester for Low Dielectric Printed Circuit Boards", SAMPE Journal, Vol. 24, No. 6, November/December 1988. A preferred polyfunctional cyanate ester is Bisphenol AD dicyanate (4,4'-ethylidene bisphenol dicyanate) available from Ciba under the trade designation Arocy L-10, and bisphenol M dicyanate commercially available as RTX-366 from Ciba-Giegy.

Other suitable cyanate ester resins include the commercial products available under the designations REX-378, REX-379, Arocy B-10, B-30, B-40S, B-50, Arocy M-10, M-20, M-30, M-40S, M-50, Arocy F-40S, and F-10 from Ciba-Giegy.

Several classes of cationic photoinitiators have been found and their use in combination with epoxies is described by G. E. Green, B. P. Stark, and S. A. Zahir, in J. Macromol. Sci. Revs. Macromol. Chem. C21, 187 (1981/82). However, a significant number of these initiators are too slow to be of any practical value. Commercially the most significant catalysts are the aryldiazoniumi triphenylsulfonium and diphenyliodonium salts, with the most recently found compounds the diaryliodosyl and triarylsulfoxonium salts which possess anions of low nucleophilicity. These are known to liberate, upon irradiation, the corresponding Lewis acids $BF_3$, $BF_5$ etc., or the Bronsted acids $HB_4$, $HPF_6$, $HAsF_6$.

The effectiveness of aryldiazonium salts as photoinitiators depends on the structure of either, the cationic and the anionic moieties of these salts. Their spectral sensitivity can be varied by modifying the structure of the aryl part of the aryldiazonium compound. Such class of photoinitiators requires generally a thermal post treatment step after irradiation to achieve satisfactory cure of the epoxy resin. However, several drawbacks such as nitrogen evolution during the photolysis step and their poor thermal stability and inherent moisture sensitivity limit the use of aryldiazonium salts as photoinitiators in a number of practical applications for epoxy curing.

Crivello in "Developments in Polymer Photochemistry 2" (N. S. Allen ed.), P. 1 Applied Science Publ., London, 1981, postulated that homolytic cleavage of one of the aryl bonds induced by a photochemical reaction is the first reaction step, then a subsequent hydrogen abstraction from a suitable donor, followed by loss of a proton yields the Bronsted acid HX. This strong Bronsted acid HX, protonates the oxirane group as the initial step with subsequent ring opening polymerization taking place. Generally, only "onium" salts with anions $BF_4^-$, $PF_6^-$, $AsF_6^-$ or $SbF_6^-$ can be used, with the polymerization rate increasing according to the sequence given before. Cycloaliphatic epoxies show higher reactivities than the glycidyl ethers and glycidyl esters. Most of the examples reported to date, involve organometallic complexes that possess photolabile ligands such as carbon monoxide, olefins, and carbocyclic rings, as described by D. M. Allen, J. Photog. Sci. 24 61 (1976) and H. Curtis, E. Irving, B. F. G. Johnson, Chem. Brit. 22 327 (1986).

Numerous organometallic compounds, such as organometal carbonyl compounds, metallocenes and aluminium complexes can act as photoinitiators in the polymerization of epoxy functionalized polymers. K. Meier and H. Zweifel, J. Imag. Sci. 30, 174 (1986) have described iron- arene salts having anions with low nucleophilicity. The photolysis of these compounds produces Lewis acids which can polymerize epoxy resins relatively easy.

The development of insoluble networks require a thermal activation step after the exposure step. Imaging systems with high resolution can be produced. Iron arene salts are generally prepared from the ferrocene according to the method reported by N. A. Nesmeyanov et al., Dokl. Akad. Nauk SSSR 149, 615 (1963).

Cyanate ester resins are made from polyfunctional cyanate monomers as described in U.S. Pat. No. 4,094,852. Generally, a catalyst is employed to achieve lower curing temperatures and faster curing times. Thermally activated catalysts which are effective include acids, bases, salts, nitrogen and phosphorous compounds, i.e., Lewis acids such as $AlCl_3$, $BF_3$, $FeCl_3$, $TiCl_4$, $ZnCl_2$, $SnCl_4$; Bronsted acids such as HCl, $H_3PO_4$, aromatic hydroxy compounds such as phenol, p-nitrophenol, pyrocatechol, dihydroxynaphthalene; various other compounds such as sodium hydroxide, sodium methoxide, sodium phenoxide, trimethylamine, triethylamine, tributylamine, diazabicyclo-2,2,2-octane, quinoline, isoquinoline, tetrahydroquinoline, tetraethylammonium chloride, pyridine-N-oxide, tributylphosphine, zinc octoate, tin octoate, zinc naphthenate, and mixtures thereof. U.S. Pat. No. 3,694,410 discloses the use of chelates of metal ions of the ionic or nonionic type with 1 to 6 or more chelate rings, to catalyze the formation of triazines from aromatic polyfunctional cyanates. Similarly, U.S. Pat. No. 4,528,366 have shown that cobalt salts of $C_6$–$C_{20}$ carboxylic acids are useful catalysts for triazine formation, preferably cobalt octoate and cobalt naphthenate. U.S. Pat. Nos. 4,604,452 and 4,608,434 disclose that alcoholic solutions of metal carboxylates are effective catalyst compositions for triazine formation by heating. Organometallic cobalt compounds have been used to catalyze the trimerization of acetylenes U.S. Pat. No. 4,183,864 and the co-trimerization of acetylenes and nitrites U.S. Pat. No. 4,328,343. The photocatalyzed trimerization of aryl isocyanates using metal carbonyl complexes has been disclosed by E. Martelli, C. Pellizzi, and G. Predieri, J. Molec. Catalysis 22, 89–91 (1983). Energy polymerizable compositions comprising ionic salts of organometallic complex cations and cationically sensitive materials and the curing thereof has been taught. European Patent Nos. 109,851; 094,914; and 094,915. U.S. Pat. No. 4,554,346 discloses photocurable resins from cyanate ester compounds. The inventors used mixtures of polyfunctional cyanate esters with at least one compound having hydroxy groups and radical-polymerizable unsaturated double bonds, the compounds used in quantities such that the ratio of cyanato groups to the hydroxy groups is in the range from 1:0.1 to about 1:2, and a radical polymerization photoinitiator, at elevated temperature. These materials would not be expected to yield the same polytriazine materials which can be obtained from direct polymerization of the cyanates only.

Organometallic compounds useful in the present invention can be prepared as described in the literature methods and as known to those skilled in the art; examples are shown in Inorg. Chem. 17, 1003 (1978), Chem. Ber. 102, 2449 (1969), J. Organomet. Chem. 135, 373 (1977), Inorg. Chem. 18, 553 (1979), those methods disclosed in EP 109851, EP 094914, EP 094915 and EP 0109851.

The curing agent can be present in the range of 0.01 to 20, preferably 0.1 to 10 weight percent of the total composition.

Surfactants in amounts of about 0.5% to about 3% and preferably about 1.2% to about 1.6% can be used to facilitate mixing the filler with the epoxy. Suitable surfactants include non-ionic type surface active agents such as Triton X-100 from Rohm and Haas Co. These surface active agents are prepared by the reaction of octylphenol or nonylphenol with ethylene oxide. Products of the above series of compounds include the Octylphenol Series and Nonylphenol Series.

The composition may optionally contain other curing promoters or accelerators and various other materials such as plasticizers, elastomers, fillers, pigments, mold release agents or other resins.

Surface treating agents that may be used in this invention are, for instance, vinyltrimethoxysilane, vinyltriethoxysilane, N(2-aminoethyl)3-aminopropyl methyldimethoxysilane, 3-aminopropylethoxysilane, 3-glycidoxypropyl trimethoxysilane, 3-glycidoxypropylmethyl dimethoxysilane. The amount of the surface treating agent used is preferably from 1 to 20 parts, more preferably from 3 to 15 parts, with respect to 100 parts of resin.

Fillers that are thermally conductive and electrically insulating fillers could be used for improving the thermal heat transfer from the device to the surroundings. Such fillers include Aluminum Oxide, 92% Alumina, 96% Alumina, Aluminum Nitride, Silicon Nitride, Silicon Carbide, Beryllium Oxide, Boron Nitride and Diamond powder either high pressure or Plasma CVD.

The compositions of the present invention contain about 25% to about 60% by weight and preferably about 50% to about 60% by weight of the binder, and correspondingly about 40% to about 75% by weight and preferably about 50% to about 60% by weight of the filler. These amounts are based upon the total amounts of binder and filler in the composition. When the binder includes the polyepoxide, the compositions employed in the present invention also include a hardening or curing agent.

The silica is preferably a fused or amorphous silica. The particle size of the filler should be 31 microns or less, and preferably from about 0.5 microns to about 31 microns, and most preferably from about 0.7 to about 20 microns. This is necessary so that the uncured material flows readily before polymerization, and so that the composition will flow under the integrated circuit chip housing 31, between the housing 31 and the substrate 11. In addition the silica filler should be substantially free of ionics and ionic impurities which might contribute to reliability problems.

The compositions of the present invention contain from about 25 percent to about 60 percent by weight, and preferably from about 50 percent to about 60 percent by weight of the liquid or flowable organic resin, balance a suitable filler capable of reducing the coefficient of thermal expansion.

Cure is effected by a presence of an effective amount, e.g., from about 0.5 weight percent to about 5 weight percent, basis epoxide, silica, and photoinitiator, of a suitable photoinitiator. One such photoinitiator is a 50 weight percent solution of triarylsulfonium antimonate salts (CAS Registry Numbers 89452-37-9 and 71449-78-0) in propylene carbonate. One such photoinitiator is Union Carbide Cyracure UVI-6974.

A series of tests were carried out with Union Carbide ERL 4221 3,4-epoxycyclohexylmethyl-3,4-epoxycyclohexane carboxylate, Novacup L337 silica, and Union Carbide Cyracure UVI-6974 triarylsulfonium antimonate salts in propylene carbonate (50 weight percent triarylsulfonium antimonate salts, basis total triarylsulfonium antimonate salts and propylene carbonate).

EXAMPLE 1

A set of experiments were performed in which equal amounts of Novacup L337 silica filler and Union Carbide ERL-4221 cycloaliphatic epoxy resin was mixed with varying amounts (0, 0.25, 0.5, 1.25, and 5%) of Union Carbide Cyracure UVI-6974 photoinitiator. The mixtures were added to aluminum sample holders and processed. The process varied from 0 to 2 min UV exposure, 0 to 280 minutes hold time, and 60 to 100 degrees C bake temperatures for 10 minutes. The thickness of the cured material resulting after a methyl ethyl ketone removal of uncured resin was recorded.

The results indicated that UV exposure was required. No material was hardened with bake only. Maximum thickness was obtained with 0.5% photoinitiator. The higher temperature bake gave greater thickness. The cured material after the lower temperature bake, while thinner, was also more flexible.

EXAMPLE 2

The following statistically designed experiment was performed to optimize depth of cure and determine the effect of various parameters. A "master" mixture was prepared by weighing 25 g of Novacup L337 silica filler into a 100 ml plastic beaker. To this was added 25 g of Union Carbide ERL-4221 cycloaliphatic resin. This was mixed by hand with a glass stirring rod to a smooth consistency. This mixture was divided into two 20 g portions. To one beaker was added 0.24 g of Union Carbide Cyracure UVI-6974 (50% mixture of photoinitiator in propylene carbonate). To the other beaker was added 2.0 g of Cyracure UVI-6974. Portions of each mixture were added to eight 30×30×4 mm aluminum caps. Each cap was exposed to a 5 mW/sq. cm. mercury lamp for the times indicated below. The caps were processed as indicated in the table. Baking was done in either a Fisher Isotemp or a Blue M oven by first bringing oven to temperature then inserting parts for time indicated. After processing the cured material was removed from the cap and rinsed in methyl ethyl ketone. This removes the lower uncured material, only the top portion of the resin cures. The thickness of the cured material was measured with a Federal model 6918-R2 bench micrometer taking the average of several readings.

TABLE I

| Run | Initiator % | Exp Dose sec | Hold time hours | Bake Temp C. | Bake time min | Cure thickness mils |
|---|---|---|---|---|---|---|
| 1 | 0.5 | 30 | 0 | 80 | 10 | 23.8 |
| 2 | 0.5 | 30 | 2 | 120 | 10 | 111.1 |
| 3 | 0.5 | 180 | 0 | 120 | 20 | 100.3 |
| 4 | 0.5 | 180 | 2 | 80 | 20 | 46.9 |
| 5 | 5.0 | 30 | 0 | 120 | 20 | 38.4 |
| 6 | 5.0 | 30 | 2 | 80 | 20 | 28.8 |
| 7 | 5.0 | 180 | 0 | 80 | 10 | 37.7, 38.5 |
| 8 | 5.0 | 180 | 2 | 120 | 10 | 49.4 |
| 9 | 5.0 | 180 | 2 | 120 | 20 | 60.8 |
| 10 | 5.0 | 180 | 0 | 80 | 20 | 45.2, 35.8 |
| 11 | 5.0 | 30 | 2 | 80 | 10 | 28.7, 24.5 |
| 12 | 5.0 | 30 | 0 | 120 | 10 | 33.5 |
| 13 | 0.5 | 180 | 2 | 80 | 10 | 42.2, 45.6 |
| 14 | 0.5 | 180 | 0 | 120 | 10 | 72.1 |
| 15 | 0.5 | 30 | 2 | 120 | 20 | 143.8 |
| 16 | 0.5 | 30 | 0 | 80 | 20 | 39.0 |

EXAMPLE 3

A mixture of resins were prepared in a glass beaker by heating on a hot plate 1 g of Epon 1007 and 9 g of ERL-4221. The hot plate was maintained at 140–150° C. for 3 hours until the Epon 1007 dissolved. While warm, 0.01 g of ethyl violet dye and then 15 g of Novacup L337 silica was added and mixed with a stir rod. The dark blue mixture was viscous when cool. The mixture was applied with a stir rod to the leads on a circuitized ceramic test substrate. The substrate was exposed for 2 minutes under the 5 mW/sq. cm. mercury lamp, then baked at 120° C. for 5 minutes. The surface had hardened. The ceramic was cooled to −70° C. several times in a freezer and warmed to room temperature. A crack was observed at a bubbled area in the applied material, otherwise the integrity and adhesion were good.

The set of sixteen runs carried out, with 0.5 weight percent to 5 weight percent initiator, a UV exposure dose of 30 to 180 seconds, a hold time of 0 to 2 hours, a bake temperature of 80 to 120 degrees Celsius, and a bake time of 10 to 20 minutes. Cure thickness of 23.0 mils to 143.8 mils were obtained. An R squared analysis of this data was performed. It was determined that initiator concentration (significance level 0.021046) and bake temperature (significance level 0.0079883) were the most significant variables.

EXAMPLE 4

A homogeneous liquid mixture was prepared by mixing 10 g of Arocy L10 from Ciba, 0.1 g of 10% solution of 8% Zn octanoate in mineral spirits from Mooney Chemicals and 0.15 gr of Irgacure 261 from Ciba. To this solution 15 g of Novacup L337 silica was added and mixed with a stir rod.

Alternatively another mixture was prepared by adding 5 gr of Arocy L10, 5 gr of MR283-250, 0.1 gr of Zn Octanoate and 0.15 gr of Irgacure 261 were added. To this solution 17 g of Novacup L337 silica was added and mixed with a stir rod.

Each sample was roll milled for 1 hr after addition and vacuum degassed to remove the entrapped air. Coatings (2 mils) of these mixtures were first baked for 15 min at 130° C., exposed for 300 sec (350 W Oriel Lamp) and baked at 150° C. for 15 minutes. The resulting cured films appeared to be of good quality and do not appear to crack upon a 90 degree bend test.

The composition protects the soldered joints from the effects of thermal cycling.

Thus there has been shown and described an improved electronic package assembly wherein encapsulant material is utilized to reinforce the electrical connections formed between the assembly's package elements and the substrate on which this package is positioned. As stated, such a package assembly has exhibited an operational life substantially greater than non-protected package assemblies (those not including encapsulant or the like material). The package assembly as defined herein is capable of being manufactured using mass production techniques and thus benefit from the advantages thereof. Although the invention has been defined with respect to low profile packages (those having a total height of only about 0.030 inch to about 0.050 inch, it is understood that the teachings herein are readily adaptable to other, higher profile package structures, including many of those well known in the art.

While there have been shown and described what are at present the preferred embodiments of the invention, it will be obvious to those skilled in the art that various changes and modifications may be made therein without departing from the scope of the invention as defined by the appended claims.

We claim:

1. A method of encapsulating a solder joint between an integrated circuit chip in a thin small outline package and a substrates, comprising the steps of:

a) forming a composition comprising an epoxy resin, an effective amount of photoinitiator, and dispersed silica, the composition exhibiting a cure depth;
   b) applying an amount of the composition at a thickness sufficient to cover substantially all of the solder joint, projecting from the thin small outline package wherein the thin small outline package has a total height of 20 to 53 mils above the substrate; and
   c) photocuring the composition to reinforce the solder joint.

2. The method of claim 1, further comprising the step of thermally curing the composition after photocuring the composition.

3. The method of claim 1, wherein the epoxy resin includes a plurality of reactive 1,2-epoxy groups.

4. The method of claim 3, wherein the epoxy resin includes a polyepoxide selected from the group consisting of monomeric, polymeric, saturated, unsaturated, aliphatic, cycloaliphatic, aromatic, and heterocyclic polyepoxides.

5. The method of claim 1, wherein the photoinitiator is an onium salt chosen from the group consisting of "onium" salts with anions $BF_4^-$, $PF_6^-$, $AsF_6^-$, and $SbF_6^-$.

6. The method of claim 1, wherein the epoxy resin exhibits a viscosity of about 300 centipoise to less than about 1,000 centipoise at a temperature of 25° C.

7. The method of claim 1, wherein the cured composition exhibits a coefficient of linear thermal expansion of about 26 ppm/°C. to less than about 39 ppm/°C. and a glass transition temperature between 100° C. and 160° C.

8. The method of claim 1, wherein the thin small outline package is positioned with a gap of 3 mils or less between the thin small outline package and circuitry on the substrate.

9. A method of encapsulating a solder joint between an integrated circuit chip in a thin small outline package and a substrate, comprising the steps of:

a) forming a composition comprising a cycloaliphatic epoxy resin, an effective amount of a triarylsulfonium antimonate photoinitiator, and dispersed silica, the composition exhibiting a cure depth;
   b) applying an amount of the composition at a thickness sufficient to cover substantially all of the solder joint, projecting from the thin small outline package wherein the thin small outline package has a total height of 20 to 53 mils above the substrate; and
   c) photocuring the composition to reinforce the solder joint.

* * * * *